United States Patent
Furusawa (10) Patent No.: US 6,384,343 B1
(45) Date of Patent: May 7, 2002

(54) SEMICONDUCTOR DEVICE

(75) Inventor: Kazuyoshi Furusawa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/724,195

(22) Filed: Nov. 28, 2000

(30) Foreign Application Priority Data

Dec. 3, 1999 (JP) ............................ 11-344905

(51) Int. Cl.$^7$ ..................... H05K 1/16; H05K 1/00; H05K 1/03; H05K 7/10
(52) U.S. Cl. ............ 174/260; 174/250; 174/255; 361/768; 361/770
(58) Field of Search ............... 174/250, 255, 174/260; 361/767, 768, 770; 29/852

(56) References Cited

U.S. PATENT DOCUMENTS

| | | | | |
|---|---|---|---|---|
| 4,617,730 A | * | 10/1986 | Geldermans et al. | 29/843 |
| 5,958,600 A | * | 9/1999 | Sotokawa et al. | 428/458 |
| 6,060,775 A | * | 5/2000 | Ano | 257/693 |
| 6,303,877 B2 | * | 10/2001 | Moriizumi et al. | 174/261 |

FOREIGN PATENT DOCUMENTS

JP          10-261737          9/1998

* cited by examiner

*Primary Examiner*—Albert W. Paladini
*Assistant Examiner*—Quynh-Nhu H. Vu
(74) *Attorney, Agent, or Firm*—Hutchins, Wheeler & Dittmar (57) ABSTRACT

The present invention provides a semiconductor device of the BGA (ball grid array) package type comprising: a semiconductor chip 1; a plurality of wiring layers 1B arranged on the semiconductor chip via an insulation layer 1A, each of the wiring layers having a chip-side land block 1C as a signal I/O region; a circuit substrate having a plurality of wiring lines; and a plurality of solder balls 2 each to be arranged on the chip-side land block for connecting the wiring layers to corresponding wiring lines on the circuit substrate; wherein each of the chip-side land blocks 1C has a land protrusion block 3 extending into the solder ball 2. The land protrusion block 3 increases the attachment strength between the chip-side land block 1C and the solder ball 2 and suppresses growth of a crack generated in the solder ball 2 due to a thermal stress.

37 Claims, 6 Drawing Sheets

PLATE-SHAPE PROTRUSION

SEMICONDUCTOR DEVICE

BACKGROUND OF THE INVENTION

1. Field of the Invention

The present invention relates to a semiconductor device and in particular, to a semiconductor device including an I/O block of the ball grid array (BGA) configuration.

2. Description of the Related Art

Recently, with increase of the number of pins and reduction of size of a semiconductor package, the conventional semiconductor package having a plurality of pin terminals tends to be replaced by a semiconductor package of the BGA configuration (called chip size package (CSP) or BGA package) as disclosed in, for example, Japanese Patent Publication 10-261737.

In this case, the semiconductor package (semiconductor device) normally includes a plurality of wiring layers (inner leads) layered via an insulation layer on a semiconductor chip. Each of the wiring layers constituting a part of the semiconductor package is provided with a land block (I/O region) of the chip side, to which solder balls are attached, thus constituting a semiconductor package (BGA package) of the ball grid array (BGA) structure.

When mounting the substrate on the package, the wiring layers of the semiconductor package side including the ball grid array (BGA) and the corresponding wiring of the substrate side are entirely heated, so that the respective circuits are connected via the solder balls.

However, in the aforementioned conventional example, as the BGA package and the substrate have different coefficients of thermal expansion, cracks are caused in the solder balls due to a temperature stress when subjected to a sudden temperature change. Moreover, because the solder balls are attached to flat planes of the substrate, the attachment strength between the solder ball and the substrate is insufficient and an open failure is easily caused by a physical stress such as vibration and shock.

SUMMARY OF THE INVENTION

It is therefore an object of the present invention to provide a semiconductor device capable improving the attachment strength between a land block of the chip side and effectively suppressing growth of a solder ball crack caused by a temperature stress.

In the order to achieve the aforementioned object, the present invention provides a semiconductor device of the BGA (ball grid array) package type comprising: a semiconductor chip; a plurality of wiring layers (inner leads) arranged on the semiconductor chip via an insulation layer, each of the wiring layers, having a chip-side land block as a signal I/O region; a circuit substrate having a plurality of wiring lines; and a plurality of solder balls each to be arranged on the chip-side land block for connecting the wiring layers to corresponding wiring lines on the circuit substrate; wherein each of the chip-side land blocks has a protrusion block extending into the solder ball toward a corresponding wiring line in the substrate.

For example, when the semiconductor device is placed under a severe temperature change, a crack is generated in the vicinity of a boundary between a solder ball and an inner lead of a corresponding chip-side land due to a stress caused by a difference of coefficients of the thermal expansion of the chip and the circuit substrate and applied in the horizontal direction in the solder ball (direction along a surface of the substrate). However, the inner stress when reaching the land protrusion block, proceeds along the land protrusion block which is different from the aforementioned direction. Thus, the stress is dispersed in indifferent directions. This effectively suppresses generation and growth of a crack.

Furthermore, the land protrusion block significantly increases the surface area of the chip-side land block, which in turn increase the attachment area between the chip-side land block and the solder ball, thereby significantly increasing the attachment strength.

Here, the land protrusion block may include a circular protrusion. Moreover, the land protrusion block may include a columnar protrusion surrounded by the circular protrusion surrounding. Furthermore, the land protrusion block may include dual circular protrusions arranged at a predetermined distance. Moreover, the land protrusion block may include a plurality of columnar (or circular) protrusions arranged at a predetermined distance.

With this configuration, even if a crack is generated and grows in any direction, the crack growth can effectively suppressed.

Moreover, the land protrusion block may include a plurality of standing plate-shaped protrusions of a predetermined width arranged at a predetermined interval and almost in parallel to one another.

With this configuration, a stress in the direction vertical to the planes of the plate-shaped protrusions can effectively suppressed by a great shear stress, thereby effectively suppressing a generation and growth of a crack.

Furthermore, the land protrusion block may include a plurality of coaxial circular protrusions having different heights in such a manner that the center protrusion is higher than the surrounding protrusions.

In this case, even a great-power crack growing over the external protrusions is stopped by the center protrusion by dispersing the crack direction. Thus, it is possible to effectively suppress growth of a great-power or small-power crack.

DESCRIPTION OF THE PREFERRED EMBODIMENTS

Figure 1:
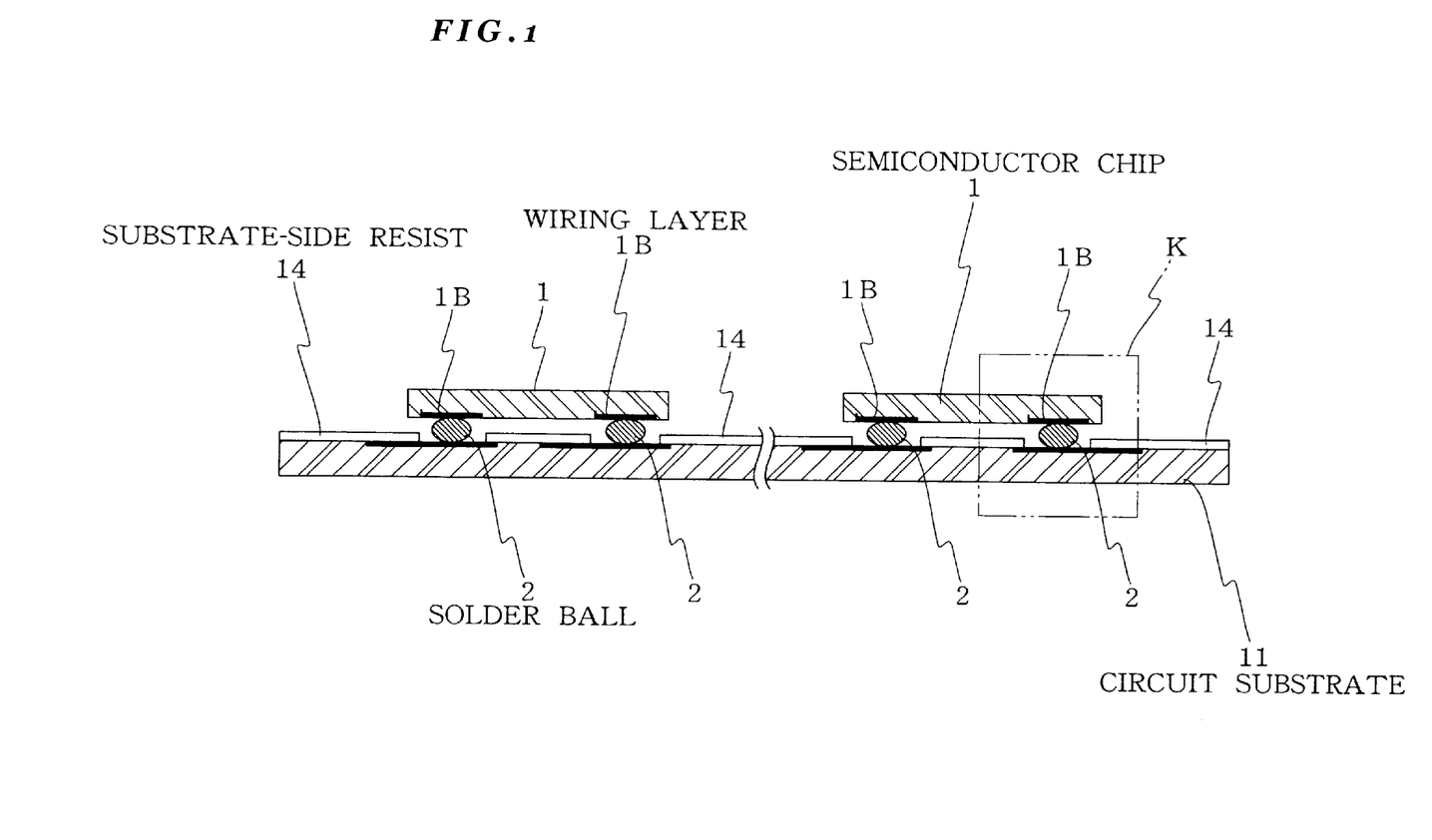
FIG. 1 is a cross sectional view of an embodiment of the present invention.
Figure 2:
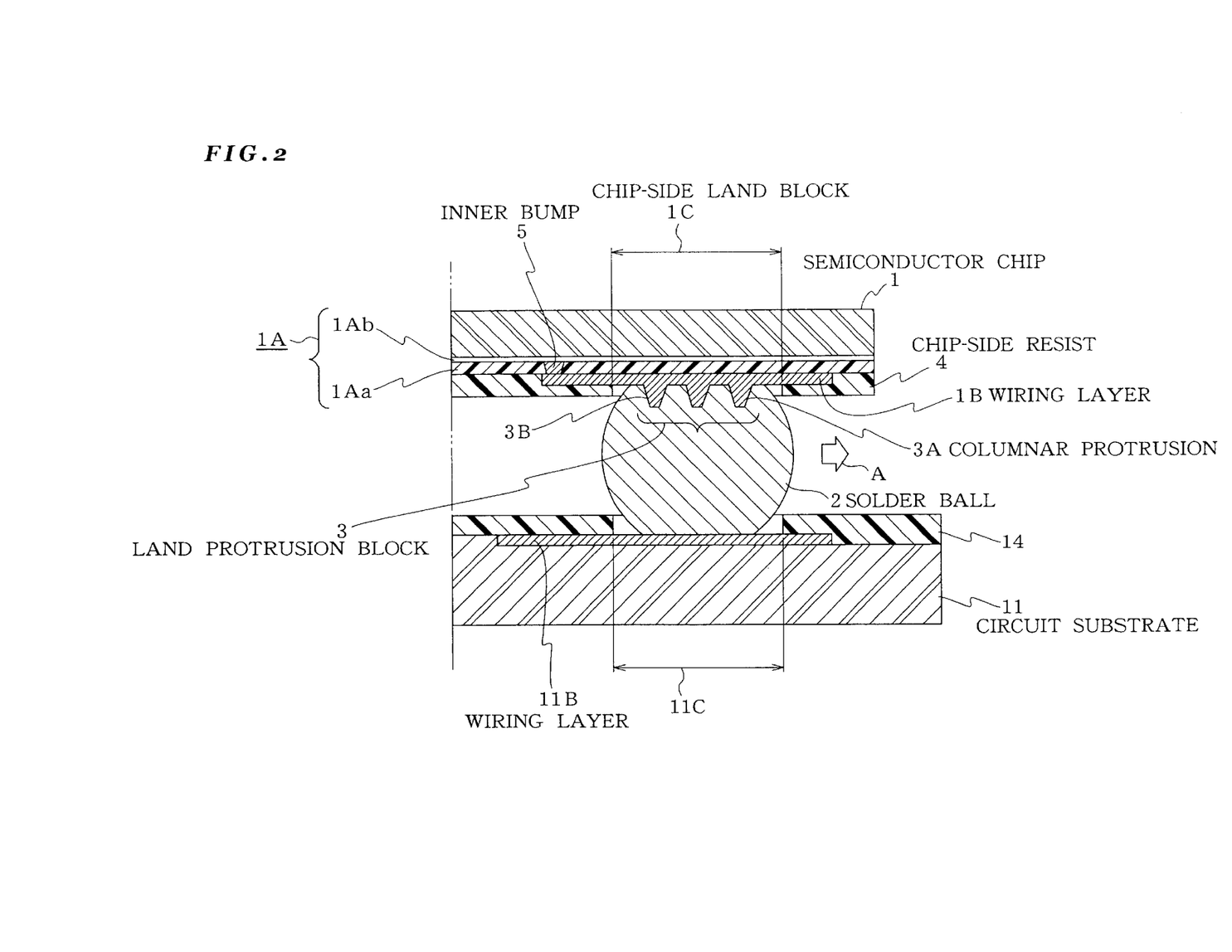
FIG. 2 is a detailed vies of a portion K in FIG. 1.
Figure 3:
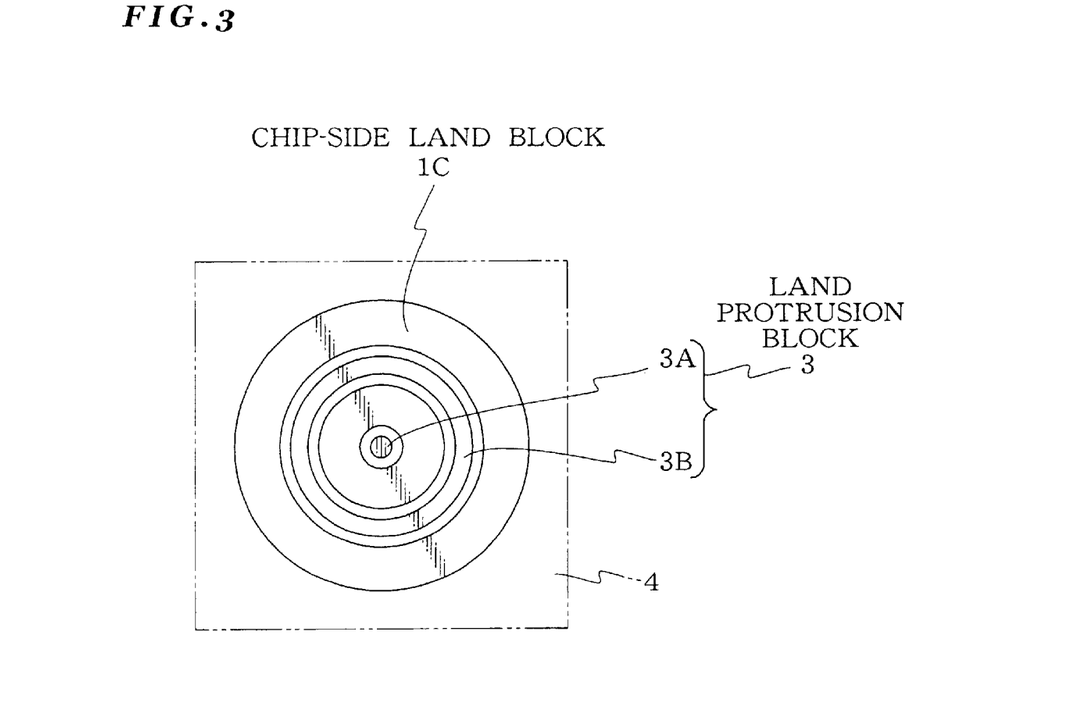
FIG. 3 shows land protrusions shown in FIG. 2.

Description will now be directed to a first embodiment of the present invention with reference to FIG. 1 to FIG. 3.

In FIG. 1 and FIG. 2, a reference symbol 1 denotes a semiconductor chip. This semiconductor chip 1 is provided with a plurality of wiring layers (inner leads) 1B via an insulation layer 1A. Each of the wiring layer 1B is provided with a chip-side land block I/O region) 1C. A reference symbol 2 denotes a solder ball provided on the chip-side land block 1C. The semiconductor chip 1 is mounted on (electrically connected to) the circuit substrate 11 via the solder ball 2.

A plurality of solder balls 2 provided o the plurality of chip-side land blocks 1C constitute a ball grid array (BGA).

In each of the wiring layers of the chip-side land block 1C, a plurality of land protrusions 3 protrude corresponding to each of the solder balls 2 toward wiring 11B of the circuit substrate 11.

In more detail, as shown in FIG. 2, the BGA package type semiconductor device is formed in a thick plate form in which a plurality of wiring layers (inner leads) 1B are arranged via the insulation layer 1A with respect to the semiconductor chip 1 which is covered by a chip-side resist 4. The chip-side land block 1C represents a portion of the wiring layer (inner lead) 1B where the chip-side resist 4 (in most cases, wiring end region of the wiring layer 1B) has been removed.

The aforementioned insulation layer 1A is made from an interposer including a polyimide (PI) tape 1A$a$ and an adhesive 1A$b$. The semiconductor chip 1 is connected to the plurality of wiring layers (inner leads) 1B via an inner bump 5 arranged through the insulation layer 1A. Moreover, as has been described above, the plurality of wiring layers 1B are connected to the corresponding solder balls 2 at the chip-side land block 1C as the open portion of the chip-side resist 4.

This chip-side land block 1C includes the land protrusion block 3 consisting of a plurality of protrusions.

Moreover, in FIG. 1 and FIG. 2, at the side of the circuit substrate 11, the solder ball 2 is connected to the wiring layer 11B at the substrate-side land block 11C as the open portion of the substrate-side resist 14. The wiring layer 11B is layered on the circuit substrate 11 so as to be covered by the substrate-side resist 14 and exposed at the substrate-side land block 11C as shown in FIG. 2.

In this embodiment, as shown in FIG. 3, the land protrusion block 3 includes a columnar protrusion 3A at the center portion which is surrounded by a circular protrusion 3B arranged at a predetermined distance from the columnar protrusion 3A.

Figure 4:
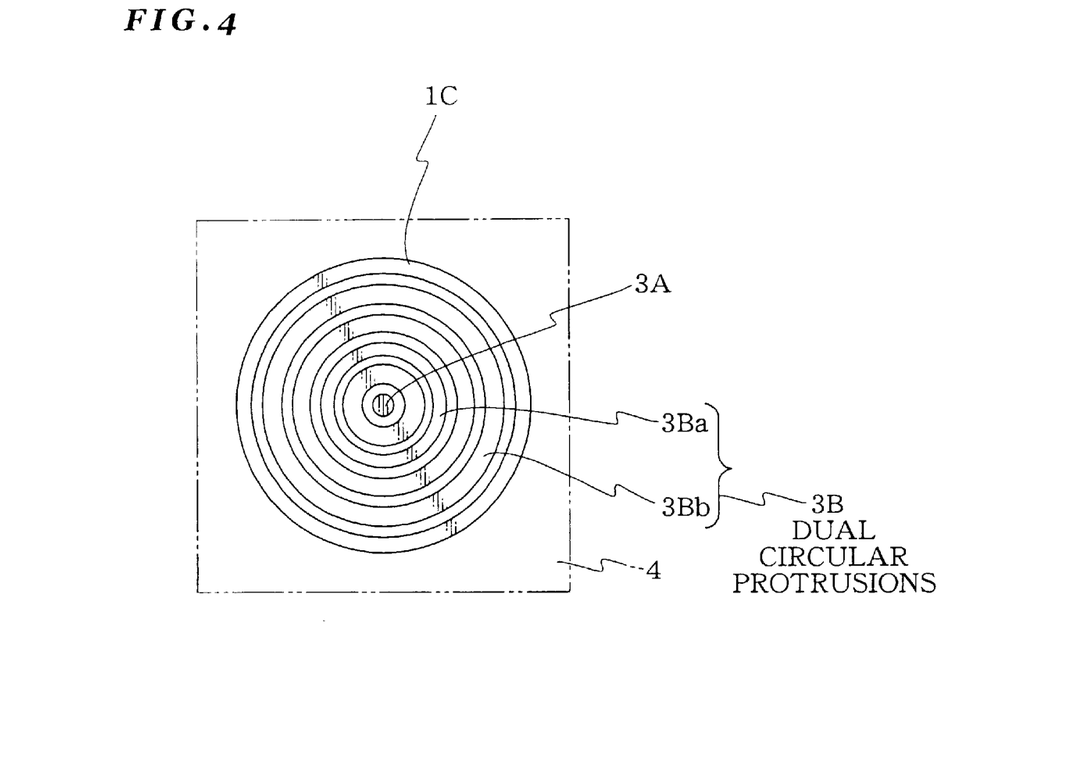
FIG. 4 shows another example of land protrusions shown in FIG. 3.
Figure 5A:
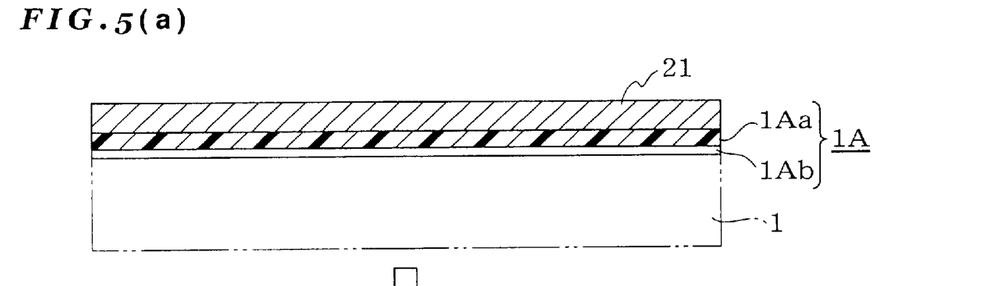
FIG. 5 shows a procedure for forming the land protrusions shown in FIG. 4, including steps of FIG. 5(a) to FIG. 5(d) in this order.
Figure 5B:
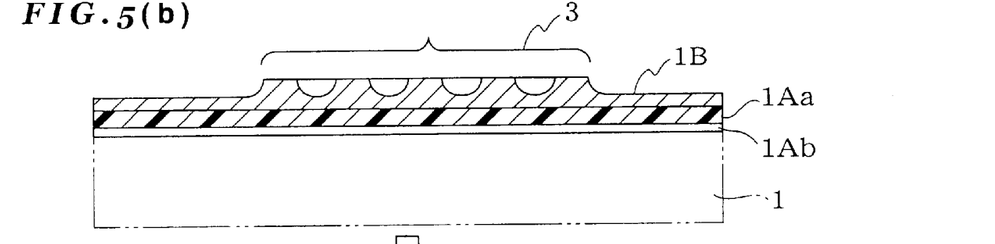
Figure 5C:
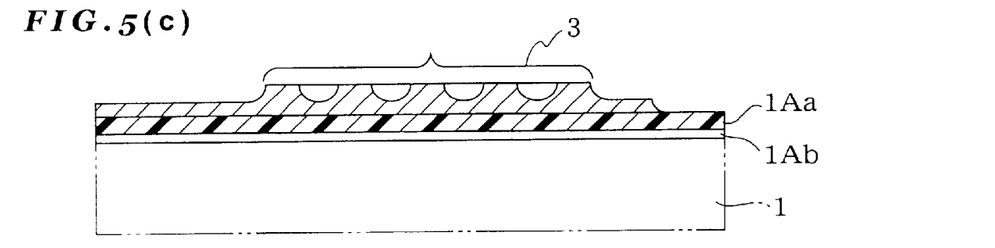
Figure 5D:
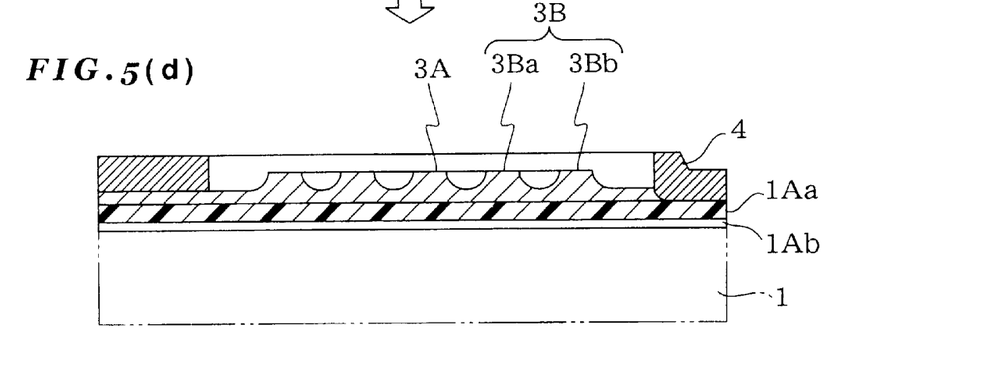

Furthermore, the land protrusion block 3 may also be realized as the columnar protrusion surrounded by two coaxial circular protrusion 3B (3B$a$, 3B$b$) arranged at a predetermined interval as shown in FIG. 4.

Next, explanation will be given on the function of the aforementioned embodiment.

In this embodiment having the land protrusion block 3 on the chip-side land block 1C which has been conventionally flat, when a thermal stress is applied when mounted on the circuit substrate 11, the difference between the coefficients of thermal expansion of the semiconductor chip 1 and the circuit substrate 11 causes a horizontal stress to be applied to the solder ball 2 as shown by arrow A in FIG. 2, for example.

In this case, a crack is caused in the vicinity of the boundary between the solder ball 2 and the wiring layer (inner leads) of the chip-side land block 1C. The crack grows along the boundary. However, when the crack reaches the land protrusion block 3, the land protrusion block 3 functions as a stopper to suppress the growth of the crack. Thus, it is possible to increase the thermal stress resistance and the shear strength.

Moreover, the land protrusion block 3 increases the land surface area, which in turn increases the contact area between the solder ball 2 and the chip-side land block 1C. This reduces the contact resistance and increases the strength in the longitudinal direction.

Next, explanation will be given on a procedure for forming the land protrusion block 3 having the center columnar protrusion 3$a$ surrounded by dual circular protrusions 3B$a$ and 3B$b$ (FIG. 4) with reference to FIG. 5($a$) to ($d$).

In FIG. 5($a$) to FIG. 5($d$), which is shown in an inverted state (upside down) compared to FIG. 2, a reference symbol 21 denotes a copper foil as a material for forming the wiring layer 1B and the land protrusion block 3. This copper foil 21 is layered on the semiconductor chip 1 via the insulation layer 1A consisting of the polyimide (PI) tape 1A$a$ and the adhesive 1A$b$.

The copper foil 21 has a thickness roughly set to a thickness necessary for the wiring layer (inner lead) 1B added by the height of the land protrusion block 3. In this embodiment, for example, the copper foil 21 has a thickness of about 40 micrometers, the wiring layer (inner lead) is set to a thickness of 20 micrometers, and the land protrusion block 3 is set to a height of about 15 micrometers.

Moreover, the polyimide (PI) tape 1A$a$ has a thickness of about 15 micrometers and the adhesive 1A$b$ has a thickness of about 10 micrometers.

Firstly, in order to form the pattern of the land protrusion block 3, a mask of the protrusion block pattern is applied to the copper foil 21 in FIG. 5 ($a$) and etching is performed by about 15 micrometers.

Next, in order to form the wiring layer (inner lead) 1B, as shown in FIG. 5($b$), a mask of the wiring pattern is applied to the copper foil having the protrusion block pattern and etching is performed by about 20 micrometers.

Lastly, in order to form the land protrusion block 3, as shown in FIG. 5($c$), a mask of the land pattern is applied to the copper foil having the protrusion block pattern and the wiring layer pattern and then resist 4 is applied. Thus, the land block 1C is complete as shown in FIG. 5($d$).

Thus, in this embodiment, the land protrusion block 3 includes the columnar protrusion 3A at the center surrounded by two coaxial circular protrusions 3B$a$ and 3B$b$. With respect to a horizontal stress (in the direction along the substrate) caused when mounting on the circuit substrate, the standing walls of the land protrusion block 3 are arranged almost at 90 degrees against a direction of a crack generated in the solder ball 2 and the distance from the line defined by the solder ball 2 and the land block to the protrusion block is set constant. Accordingly, it is possible to improve the durability in all the directions.

While the embodiment has been explained through an example of the land protrusion block 3 including the central columnar protrusion 3A (FIG. 3, FIG. 4), this columnar protrusion 3A may be removed, leaving the center as an indentation.

Figure 6:
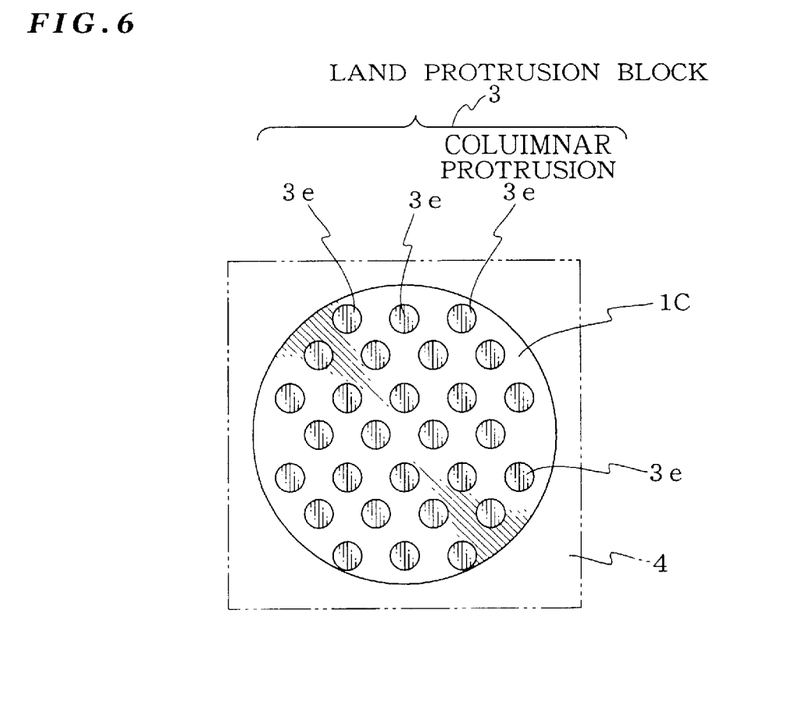
FIG. 6 shows still another example of land protrusions shown in FIG. 3.

Moreover, while the embodiment has been explained through an example of the land protrusion block 3 including the columnar protrusion 3A surrounded by a circular protrusion 3B (or 3B$a$ and 3B$b$), the protrusion block 3 may be realized by a plurality of columnar protrusions 3$e$ arranged at a predetermined interval from one another as shown in FIG. 6.

Figure 7:
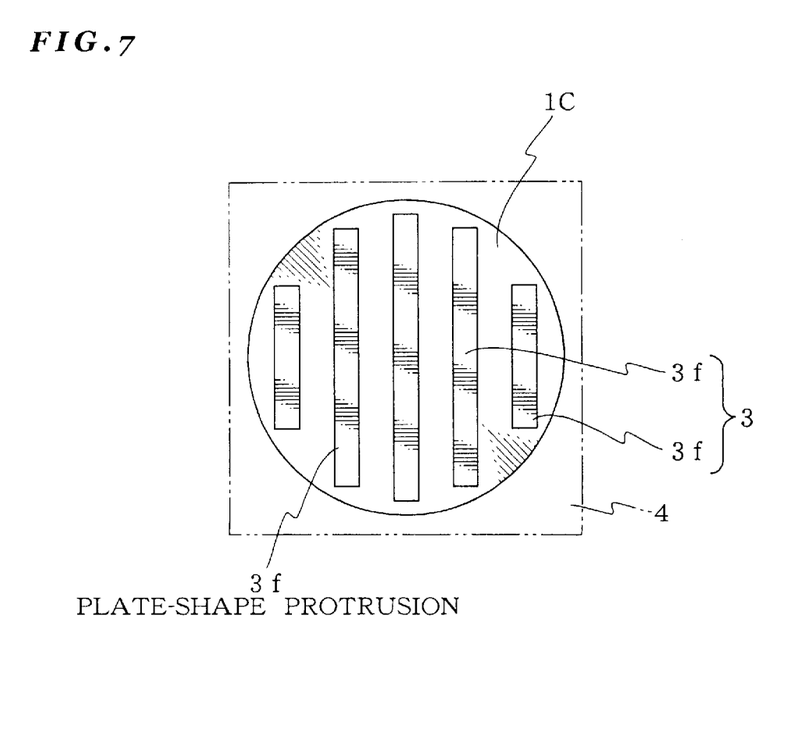
FIG. 7 shows still yet another example of land protrusions shown in FIG. 3.
Figure 8A:
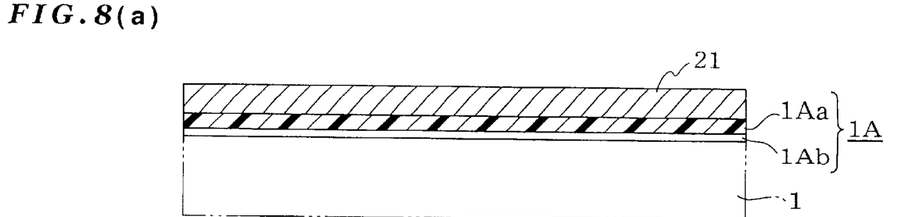
FIG. 8 shows a procedure for forming land protrusions according to another embodiment, including steps FIGS. 8(a) to FIG. 8(e) in this order.
Figure 8B:
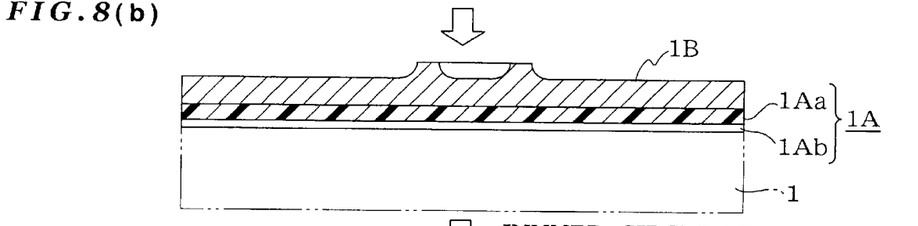
Figure 8C:
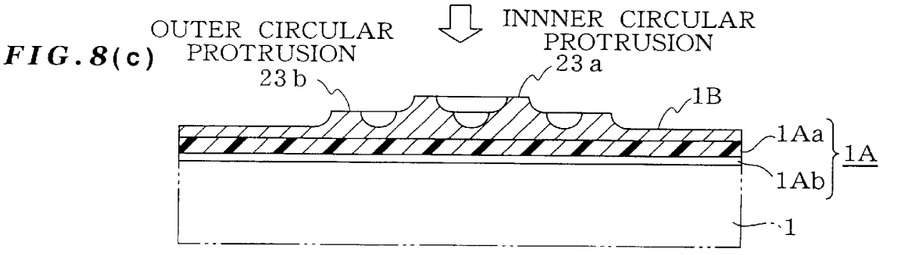
Figure 8D:
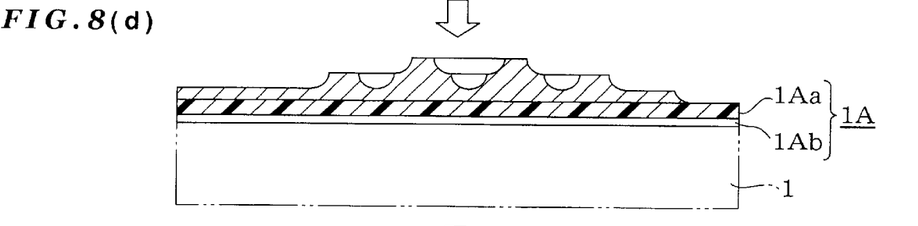
Figure 8E:
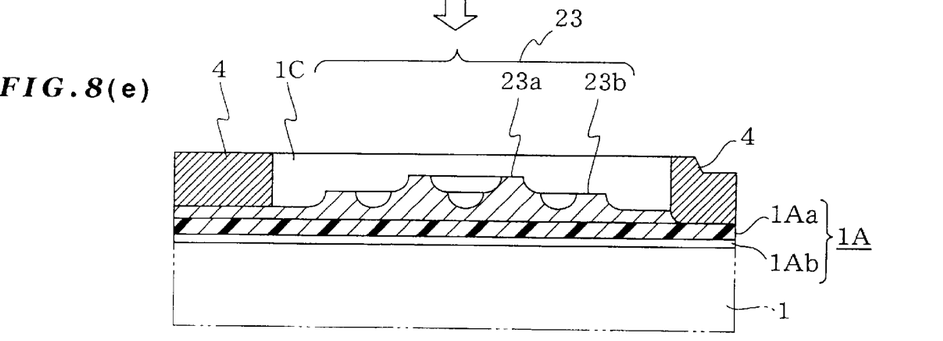

Furthermore, the land protrusion block 3 may be realized a plurality of plate-shaped protrusions 3$f$ arranged at a predetermined interval and parallel to one another as shown in FIG. 7.

With this configuration, it is possible to effectively prevent progress of a crack over a wide range against cracking in a direction vertical to the plate-shaped protrusions 3f.

Next, explanation will be given on another embodiment of the land protrusion block with reference to FIG. 8.

In this embodiment, as shown in FIG. 8, a land protrusion block 23 includes dual circular protrusions having different heights.

In this embodiment of FIG. 8, as compared to the aforementioned example of FIG. 5 where the land protrusion block 3 and the wiring layer (inner lead) 1B patterns are formed by two etching processes, three etching processes are performed. That is, a first etching forms an inner circular protrusion 23a a shown in FIG. 8(b), a second etching forms an outer circular protrusion 23b having a lower height as shown in FIG. 8(c), and a third, last etching forms a wiring layer (inner lead) 1B pattern, thus completing the land block 1C having circular protrusion of different heights.

The other configurations are identical to the embodiment of FIG. 5.

When the protrusions have an identical height as shown in FIG. 5, a crack generated in the solder ball 2 and growing to exceed the outer protrusion further grows along the upper surface of the inner protrusion. Accordingly, in this case, the inner circular protrusion may not function as a stopper. In contrast to this, when the inner circular protrusion is higher than the outer protrusion as shown in FIG. 8, a crack growing to exceed the outer circular protrusion 23b can be stopped by the inner circular protrusion 23a as the next stopper. Thus, it is possible to obtain a higher thermal stress resistance and shear strength.

In this case, it is also possible to increase the number of etching processes so as to form three or more circular protrusions having different heights.

In the embodiments of FIG. 5 and FIG. 8 a protrusion pattern is formed on the copper surface using a mask. However, it is also possible to avoid need to use a mask and to perform an irregular etching to form protrusions of random configurations. According to this method, it is possible to reduce the number of production steps, which in turn enables to form the land protrusion block in the land region at a lower cost.

The present invention having the aforementioned configuration functions as has been described above. That is, the land protrusion block arranged on the chip-side land functions as a stopper against a crack generated in a solder ball. Thus, it is possible to improve the thermal stress resistance and the shear strength of the entire BGA package.

When a horizontal stress due to a thermal stress is applied into the inside of a solder ball (in the direction along the surface of a wiring substrate), a crack is often generated at a junction portion between the solder ball and the wiring layer (inner lead) and the crack grows along the boundary between the solder ball and the wiring layer. However, when the crack reaches the land protrusion block, the crack grow in the longitudinal direction along the land protrusion block. Since this direction is different from the stress direction, the land protrusion block disperses the stress direction and functions as a stopper. As a result, it is possible to increase the strength of the BGA portion against a horizontal stress, thus increasing the thermal stress resistance and the shear strength.

Furthermore, the land protrusion block arranged on the chip-side land block significantly increases the surface area, which in turn increases the attaching strength of the solder ball. More specifically, as the land protrusion block is arranged on the chip-side land block, the land surface area is increased to increase the attachment surface between the solder ball and the chip-side land block. Since the attachment strength of the solder ball is proportional to the area, the land protrusion block arranged on the chip-side land block increases the attachment strength and increases the strength not only against a horizontal stress but also against a vertical force. Thus, it is possible to increase the thermal stress resistance and the shear strength of the ball grid array (BGA). That is, it is possible to provide an excellent BGA package type semiconductor device having advantages over the conventional example.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-344905 (Filed on Dec. $3^{rd}$, 1999) including specification, claims, drawings and summary are incorporated herein by reference in its entirety.

What is claimed is:

1. A semiconductor device of the BGA package type comprising:
   a semiconductor chip;
   a plurality of wiring layers arranged on the semiconductor chip via an insulation layer, each of the wiring layers having a clip-side land block as a signal I/O region;
   a circuit substrate having a plurality of wiring lines; and
   a plurality of solder balls each to be arranged on the chip-side land block for connecting the wiring layers to corresponding wiring lines on the circuit substrate;
   wherein each of the chip-side land blocks has a land protrusion block that includes a plurality of protrusions extending into the solder bail toward a corresponding wiring line in the substrate.

2. A semiconductor device as claimed in claim 1, wherein the land protrusion block includes a circular protrusion having an indentation in the center portion.

3. A semiconductor device as claimed in claim 1, wherein the land protrusion block includes a circular protrusion and a columnar protrusion surrounded by the circular protrusion.

4. A semiconductor device as claimed in claim 1, wherein the land protrusion block includes dual circular protrusions arranged at a predetermined distance.

5. A semiconductor device as claimed in claim 1, wherein the land protrusion block includes a columnar protrusion surrounded by dual circular protrusions arranged at a predetermined distance.

6. A semiconductor device as claimed in claim 1, wherein the land protrusion block includes a plurality of coaxial circular protrusions.

7. A semiconductor device as claimed in claim 1, wherein the land protrusion block includes a columnar protrusion surrounded by a plurality of coaxial circular protrusions.

8. A semiconductor device as claimed in claim 1, wherein the land protrusion block includes a plurality of columnar protrusions arranged at a predetermined distance.

9. A semiconductor device as claimed in claim 1, wherein the land protrusion block includes a plurality of plate-shaped protrusions having a predetermined width and arranged at a predetermined distance and in almost parallel to one another.

10. A semiconductor device as claimed in claim 6, wherein the plurality of coaxial circular protrusions have different heights in such a manner that the center protrusion is higher than the surrounding protrusions.

11. A semiconductor device as claimed in claim 1, wherein the land protrusion block includes a plurality of random protrusions having random shapes.

12. A semiconductor device as claimed in claim 11, wherein the random protrusions are formed by means of etching.

13. A semiconductor device as claimed in claim 1, wherein the land protrusion block is made from a copper material.

14. A semiconductor device as claimed in claim 10, wherein the land protrusion block is made from a copper material.

15. A semiconductor device as claimed in claim 11, wherein the land protrusion block is made from a copper material.

16. A semiconductor device as claimed in claim 13, wherein the land protrusion is formed by etching of the copper material.

17. A semiconductor device as claimed in claim 14, wherein the land protrusion is formed by etching of the copper material.

18. A semiconductor device as claimed in claim 15, wherein the land protrusion is formed by etching of the copper material.

19. A semiconductor device of a BGA package type comprising:
   a semiconductor chip;
   a plurality of wiring layers arranged on the semiconductor chip via an insulation layer, each of the wiring layers having a chip-side land block as a signal I/O region; and
   a plurality of solder balls each to be arranged on the chip-side land block.

20. A semiconductor device as claimed in claim 19, wherein the land protrusion block includes a circular protrusion having an indentation in the center portion.

21. A semiconductor device as claimed in claim 19, wherein the land protrusion block includes a circular protrusion and a columnar protrusion surrounded by the circular protrusion.

22. A semiconductor device as claimed in claim 19, wherein the land protrusion block includes dual circular protrusions arranged at a predetermined distance.

23. A semiconductor device as claimed in claim 19, wherein the land protrusion block includes a columnar protrusion surrounded by dual circular protrusions arranged at a predetermined distance.

24. A semiconductor device as claimed in claim 19, wherein the land protrusion block includes a plurality of coaxial circular protrusions.

25. A semiconductor device as claimed in claim 19, wherein the land protrusion block includes a columnar protrusion surrounded by a plurality of coaxial circular protrusions.

26. A semiconductor device as claimed in claim 19, wherein the lad protrusion block includes a plurality of columnar protrusions arranged at a predetermined distance.

27. A semiconductor device as claimed in claim 19, wherein the land protrusion block includes a plurality of plate-shaped protrusions having a predetermined width and arranged at a predetermined distance and in almost parallel to one another.

28. A semiconductor device as claimed in claim 24, wherein the plurality of coaxial circular protrusions have different heights in such a manner that the center protrusion is higher than the surrounding protrusions.

29. A semiconductor device as claimed in claim 19, wherein the land protrusion block includes a plurality of random protrusions having random shapes.

30. A semiconductor device as claimed in claim 29, wherein the random protrusions are formed by means of etching.

31. A semiconductor device as claimed in claim 19, wherein the land protrusion block is made from a copper material.

32. A semiconductor device as claimed in claim 28, wherein the land protrusion block is made from a copper material.

33. A semiconductor device as claimed in claim 29, wherein the land protrusion block is made from a copper material.

34. A semiconductor device as claimed in claim 31, wherein the land protrusion is formed by etching of the copper material.

35. A semiconductor device as claimed in claim 32, wherein the land protrusion is formed by etching of the copper material.

36. A semiconductor device as claimed in claim 33, wherein the land protrusion is formed by etching of the copper material.

37. A semiconductor device of a BGA package type comprising:
   a semiconductor chip;
   a plurality of wiring layers arranged on the semiconductor chip trough an insulation layer, each of the wiring layers having a chip-side land block as a signal I/O region; and
   a plurality of solder balls each to be a ranged on the chip-side land block, wherein each of the chip-side land blocks has a land protrusion block that includes a plurality of protrusions extending outwardly beyond a height of said insulation layer.

* * * * *